United States Patent
Reznicek (10) Patent No.: US 10,541,242 B2
(45) Date of Patent: Jan. 21, 2020

(54) VERTICAL TRANSISTOR WITH EDRAM

(71) Applicant: International Business Machines Corporation, Armonk, NY (US)

(72) Inventor: Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/986,203

(22) Filed: May 22, 2018

(65) Prior Publication Data

US 2019/0363090 A1 Nov. 28, 2019

(51) Int. Cl.
| | |
|---|---|
| *H01L 21/02* | (2006.01) |
| *H01L 21/306* | (2006.01) |
| *H01L 21/762* | (2006.01) |
| *H01L 27/108* | (2006.01) |
| *H01L 27/12* | (2006.01) |

(Continued)

(52) U.S. Cl.
CPC .. *H01L 27/10832* (2013.01); *H01L 21/02532* (2013.01); *H01L 21/02595* (2013.01); *H01L 21/02639* (2013.01); *H01L 21/3065* (2013.01); *H01L 21/30625* (2013.01); *H01L 21/76283* (2013.01); *H01L 27/10858* (2013.01); *H01L 27/10873* (2013.01); *H01L 27/1203* (2013.01); *H01L 28/60* (2013.01); *H01L 29/66553* (2013.01); *H01L 29/66666* (2013.01); *H01L 29/7827* (2013.01); *H01L 21/76267* (2013.01); *H01L 21/76275* (2013.01); *H01L 29/0847* (2013.01)

(58) Field of Classification Search
CPC ......... H01L 27/10832; H01L 27/10858; H01L 27/10873; H01L 28/60; H01L 29/66553; H01L 29/66666; H01L 29/7827; H01L 29/0847; H01L 21/76267; H01L 21/76275; H01L 21/10832; H01L 21/02532; H01L 21/02595; H01L 21/02639; H01L 21/30625; H01L 21/3065; H01L 21/76283; H01L 27/1203
USPC ........................................................ 257/302
See application file for complete search history.

(56) References Cited

U.S. PATENT DOCUMENTS

| | | |
|---|---|---|
| 6,355,520 B1 | 3/2002 | Park et al. |
| 6,391,703 B1 | 5/2002 | Rovedo et al. |

(Continued)

OTHER PUBLICATIONS

Divakaruni et al., "Technologies for Scaling Vetical Transistor DRAM Cells to 70NM," 2003 Symposium on VLSI Technology Digest of Technical Papers, 59 pages.

(Continued)

*Primary Examiner* — Tong-Ho Kim
(74) *Attorney, Agent, or Firm* — Patterson + Sheridan, LLP (57) ABSTRACT

Structures and methods for making vertical transistors in the Embedded Dynamic Random Access Memory (eDRAM) scheme are provided. A method includes: providing an SOI substrate with a buried insulator layer therein, forming a trench through the substrate, filling the trench with a first polysilicon material, and after filling the trench with the first polysilicon material, i) growing a second polysilicon material over the first polysilicon material and ii) epitaxially growing a doped layer over the SOI substrate, wherein the grown second polysilicon material and epitaxially grown doped layer form a basis for a strap merging the doped layer and the second polysilicon material.

19 Claims, 5 Drawing Sheets

(51) Int. Cl.
- *H01L 29/66* (2006.01)
- *H01L 29/78* (2006.01)
- *H01L 29/08* (2006.01)
- *H01L 49/02* (2006.01)
- *H01L 21/3065* (2006.01)

(56) References Cited

U.S. PATENT DOCUMENTS

| | | |
|---|---|---|
| 6,727,539 B2 | 4/2004 | Divakaruni et al. |
| 6,858,891 B2 | 2/2005 | Farnworth et al. |
| 7,129,130 B2 | 10/2006 | Adkisson et al. |
| 8,120,094 B2 | 2/2012 | Liaw et al. |
| 8,492,819 B2 | 7/2013 | Anderson et al. |
| 8,557,670 B1 | 10/2013 | Cai et al. |
| 8,673,729 B1 | 3/2014 | Basker et al. |
| 9,059,213 B2 | 6/2015 | Booth, Jr. et al. |
| 2002/0076880 A1* | 6/2002 | Yamada ............ H01L 27/10841 438/243 |
| 2005/0285175 A1 | 12/2005 | Cheng et al. |
| 2010/0283093 A1 | 11/2010 | Pei et al. |
| 2013/0328161 A1* | 12/2013 | Cheng ................ H01L 29/0649 257/508 |

OTHER PUBLICATIONS

"Vertical DRAM Cell Structure Using Vertical Transistor in the Trench Capacitor," An IP.com Prior Art Database Technical Disclosure, Original Publication Date: Aug. 1, 1990, IP.com Electronic Publication Date: Mar. 16, 2005, 5 pages.

IBM, List of IBM Patents or Patent Applications Treated as Related for U.S. Appl. No. 15/986,203, filed May 22, 2018.

U.S. Appl. No. 15/986,154, entitled "Vertical Transistor with eDRAM," filed May 22, 2018.

\* cited by examiner

VERTICAL TRANSISTOR WITH EDRAM

BACKGROUND

The present disclosure relates to a semiconductor structure and a method of forming the same. More particularly, the present disclosure relates to semiconductor structures including vertical transistor structures employing deep trenches which may be used in memory devices such as, e.g., embedded dynamic random access memory (eDRAM) in order to enhance device density and mitigate deficiencies associated with shorting and lateral overgrowth issues, including lateral eDRAM to eDRAM shorts.

DRAM employs memory cells usually having a transistor and a storage capacitor embedded in a deep trench and arranged in series. eDRAM embeds these memory cells into the same semiconducting material that contains a microprocessor, which allows for wider buses and faster operating speeds (as compared to DRAM) in an integrated circuit (IC) chip. Many of these embedded memory cells, including transistors and storage capacitors, can be arranged on a single chip or within a single package to define an array. Operation of the memory cells is controlled by various circuits, many of which are structurally different from each other and warrant different manufacturing techniques.

Conventional vertical transistors are devices where the source-drain current flows in a direction normal to the substrate surface. In such devices, a vertical semiconductor pillar defines the channel with the source and drain located at opposing ends of the semiconductor pillar. One advantage of a vertical transistor is that the channel length is not defined by lithography, but by methods such as epitaxy or layer deposition, which enable precise dimensional control.

As such, vertical transistors are an attractive option for technology scaling to smaller nodes, but the increasing density in those technology nodes introduces various adverse effects that require attention to improve device performance.

SUMMARY

One aspect of the present disclosure includes a method for making a semiconductor structure. The method includes providing an SOI substrate with a buried insulator layer therein, forming a trench through the substrate, filling the trench with a first polysilicon material, and after filling the trench with the first polysilicon material, growing i) a second polysilicon material over the first polysilicon material and ii) a doped layer over the SOI substrate, wherein the grown second polysilicon material and epitaxially grown doped layer form a basis for a strap merging the doped layer and the second polysilicon material.

Another aspect of the present disclosure includes: providing an SOI substrate with a buried insulator layer therein, forming a trench through the substrate, filling the trench with a first polysilicon material, and after filling the trench with the first polysilicon material, i) growing a second polysilicon material over the first polysilicon material and ii) epitaxially growing a doped layer over the SOI substrate, where the grown second polysilicon material and epitaxially grown doped layer form a basis for a strap merging the doped layer and the second polysilicon material, prior to performing the growth, depositing a plurality of inner spacers on at least two exposed sidewalls of the trench, depositing a second hardmask or cutmask over a portion of the doped layer and the second polysilicon material, removing an exposed portion of i) the doped layer and ii) the second polysilicon material to form a recess over a portion of the doped layer, removing the second hardmask, and creating a shallow-trench isolation region in the recessed portion of the doped layer, where the remaining portion of the second polysilicon material and the doped layer form the strap, and where the deposition of the second hardmask is such that it covers a suitable area such that when the second hardmask is removed it enables formation of the strap.

Another aspect of the present disclosure includes a semiconductor structure. The semiconductor structure includes: an SOI substrate with a buried insulator therein, a doped layer disposed over the SOI substrate, a trench formed through the SOI substrate, with a dielectric liner deposited along an exposed perimeter therein, a first polysilicon material filling the trench in the substrate, a second polysilicon material in contact with the first polysilicon material, wherein the second polysilicon material and the doped layer forming a connection over the SOI substrate, and a shallow-trench isolation (STI) region in contact with the connection, forming a strap in the structure and separating it from at least one neighboring device.

Another aspect of the present disclosure includes a semiconductor structure. The semiconductor structure includes: at least two neighboring Embedded Dynamic Random Access Memory (eDRAM) structures each including: an SOI substrate with a buried insulator therein, a doped layer disposed over the SOI substrate, a trench formed through the SOI substrate, with a dielectric liner deposited along an exposed perimeter therein, a first polysilicon material filling the trench in the substrate, a second polysilicon material in contact with the first polysilicon material, wherein the second polysilicon material and the doped layer forming a connection over the SOI substrate, a transistor spacer layer over i) the doped layer, ii) the second polysilicon material, and iii) the shallow-trench isolation layer, a shallow-trench isolation (STI) region in contact with the connection, forming a strap in the structure and separating it from at least one neighboring device and a vertical transistor structure over the transistor spacer layer, wherein the shallow-trench isolation region of one of the at least two eDRAM structures electrically isolates the vertical transistor structure of one of the at least two eDRAM structures from another vertical transistor structure of another one of the least two eDRAM structures.

DETAILED DESCRIPTION

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

One aspect of the present disclosure includes forming and connecting an eDRAM infrastructure in the vertical transport field effect transistor ("VTFET") scheme. In one embodiment, this results in space savings and prevention of electrical shorts, where one or more of these benefits is provided by one or more features of the present disclosure, including by employing either one or both of i) a strap, e.g. doped polycrystalline semiconductor material, formed during the epitaxial growth of semiconductor source/drain regions, e.g. doped single crystalline material, of a vertical device and/or ii) employing an eDRAM hard mask or cutmask to facilitate the latter. One advantage of employing this scheme and establishing large space savings is increased device density. This is a general driving force for transistor development, and particularly for vertical transistor device and integration development. According to one embodiment, the general space reduction in the vertical transistor context is enhanced by connecting the bottom of a vertical device, e.g. source/drain region, with an eDRAM strap. In one embodiment, a vertical transistor device is formed laterally, but in close proximity to an eDRAM trench, where in one embodiment, this results in a slight offset between the eDRAM trench and the vertical transistor device, with the distance between the eDRAM strap and the vertical transistor being minimized.

In one embodiment, one or more features and techniques of the present disclosure provides for an eDRAM cell connecting with the vertical device by having a doped polycrystalline semiconductor material formed during epitaxial growth of source/drain regions, e.g. doped single crystalline regions, of the vertical device. One of the advantages of this feature is that formation of bottom source drain epitaxy and the strap can occur at the same process step. In one embodiment, after chemical-mechanical planarization, as opposed to conventional techniques, a dimensionally configured hardmask or cutmask is used. The cut mask is deposited in a manner that enables removal of material that is not part of the eDRAM cell or the vertical transistor device. For example, the cutmask enables removal of some of the grown material over the substrate, e.g. uncovered polycrystalline material underneath the cutmask is removed. In one embodiment, this also enables subsequent formation of a shallow-trench isolation layer or region (STI) around the deep-trench/eDRAM and the VTFET, while also allowing for a larger strap size. One or more of these features reduces shorting problems associated with lateral devices, e.g. shorts between one or more lateral EDRAM devices, while also enhancing overall device density, both of which are particularly important improvements for technology nodes less than or equal to 14 nm. For example, this scheme, per one embodiment, prevents lateral shorts between multiple devices or other adverse connectivity issues, as forming the STI region after the epitaxial growth for strap formation prevents an adverse electrical connection between one or more neighboring eDRAM structures from taking place. Furthermore, pursuant to one embodiment, the VTFET channel is only epitaxially grown and/or deposited where needed, eliminating issues associated with portions of the VTFET running over eDRAM trenches.

Figure 1A:
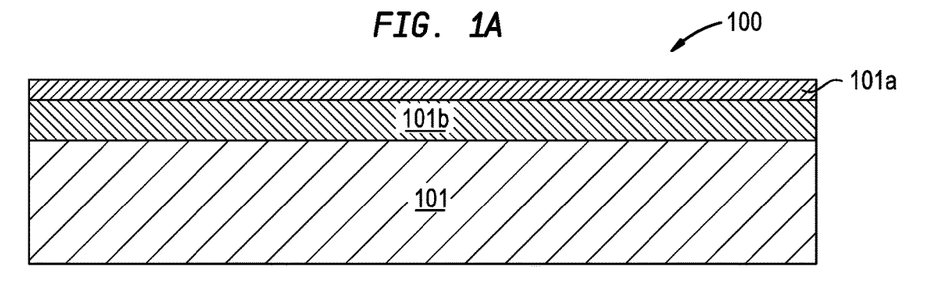
FIG. 1A illustrates a substrate suitable for use with one or more embodiments of the present disclosure.
Figure 1B:
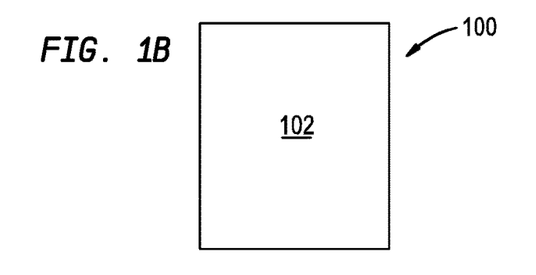
FIG. 1B illustrates a top-down view of the structure associated with FIG. 1A.

FIG. 1A illustrates a semiconductor substrate structure 100 which includes one or more semiconductor materials. FIG. 1B is a top-down view of 100. In one embodiment, the semiconductor substrate structure includes a base substrate layer 101, an insulator layer 101b, and a semiconductor material layer 101a. Non-limiting examples of suitable materials for layers 101 and 101a include Si (silicon), strained Si, Ge (germanium), SiGe (silicon germanium), Si alloys, Ge alloys, III-V materials (e.g., GaAs (gallium arsenide), InAs (indium arsenide), InP phosphide (indium phosphide), or Gallium Indium arsenide (InGaAs)), II-VI materials (e.g., CdSe (cadmium selenide), CdS (cadmium sulfide), CdTe (cadmium telluride), ZnSe (zinc selenide), ZnS (zinc sulfide), or ZnTe (zinc telluride)), or any combination thereof. The insulator layer 101b can be any suitable material for an insulator, including an oxide or a nitride.

In one embodiment, the substrate 100 is a silicon-on-insulator substrate 100, that includes a base substrate 101 comprising n-doped silicon, an oxide insulator layer, e.g. a buried oxide layer (BOX), and the semiconductor material layer 101b would be an SOI layer 101b. In one embodiment, the dopant concentration of layer 101 can range from $5 \times 10^{18}$ atoms/cm$^3$ to $5 \times 10^{19}$ atoms/cm$^3$, although other concentrations are possible and consistent with the teachings described herein.

The base substrate layer 101 and the semiconductor material layer 101a of the SOI substrate may have the same or different crystal orientation. For example, the crystal orientation of the base substrate layer 101 and/or the semiconductor material layer 101a can be {100}, {110}, or {111}, and/or other crystallographic orientations not explicitly specified herein. In one embodiment, At least the semiconductor material layer 101a substrate is single crystalline, the base substrate layer 101 of the SOI substrate may be single crystalline, polycrystalline, or amorphous.

The insulator layer 101b of the SOI substrate may be a crystalline or non-crystalline oxide and/or nitride. In one embodiment, the insulator layer 101b is an oxide such as, for example, silicon dioxide. In one embodiment, the insulator layer 101b is a nitride such as, for example, boron nitride. In one embodiment, the insulator layer 101b is a multilayered stack including in any order, a layer of boron nitride and a layer of silicon dioxide.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the layer 101a to having a thickness that is more desirable.

The semiconductor material layer 101a of the SOI substrate typically has a thickness from 10 nm to 100 nm. The insulator layer 101b of the SOI substrate typically has a thickness from 1 nm to 200 nm. The thickness of the base substrate 101 of the SOI substrate is typically from 3 μm to 100 μm. Other thicknesses for the layers 101, 101a, and 101b are contemplated consistent with the teachings of the present disclosure.

Figure 2A:
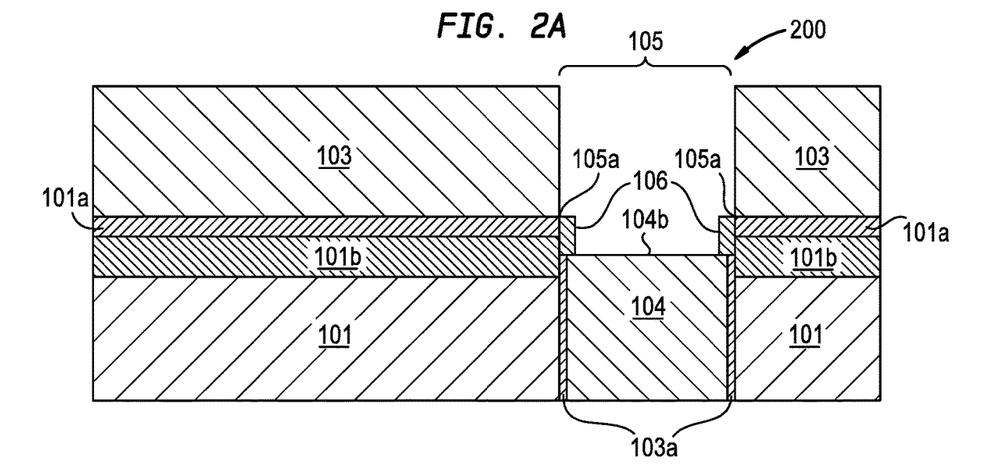
FIG. 2A illustrates a structure employing a hard mask in accordance with at least one embodiment of the present disclosure.
Figure 2B:
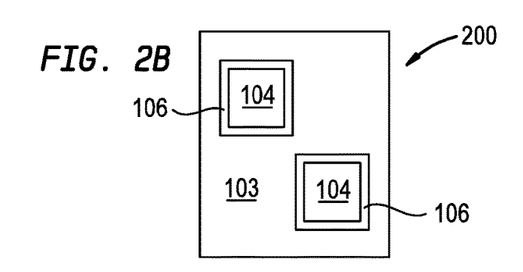
FIG. 2B illustrates a top-down view of the structure associated with FIG. 2A.

FIG. 2A illustrates formation of a trench 105, e.g. deep trench associated with eDRAM, and other modifications to the structure 100 in accordance with one or more embodiments of the present disclosure, resulting in the structure 200. FIG. 2B is a top-down view of 200. Pursuant to this embodiment, the trench, e.g. deep trench, is a trench associated with eDRAM development, and is developed prior to depositing a doped source layer over the SOI layer 101a. A hardmask 103 is deposited over the SOI layer 101a using any suitable hardmask deposition techniques. The hardmask 103 can be a nitride, oxide, or other suitable material. After depositing the hard mask, the trench 105 is formed using a suitable etches technique, including reactive ion etching (ME) to create an opening as shown in the structure 200. In one embodiment, the RIE technique is substantially anisotropic (for which many suitable processes are known). The trench 105 defines an area in which the eDRAM cell will be formed. In one embodiment, the depth of the trench may be from 1 μm to 10 μm. In one embodiment, the trench is approximately 4 μm in depth, although other dimensions are contemplated in accordance with the techniques of the present disclosure.

The trench 105 may be partially or substantially filled with a conductive polycrystalline material 104, e.g. polysilicon 104 to form the basis of a capacitor. (Polysilicon material 104 is referred to interchangeably as polysilicon 104, polysilicon material 104, polysilicon layer 104, or layer 104). In one embodiment, the polysilicon material 104 fills the trench 105 to a height where the upper surface of the polysilicon 104 is below the upper surface of the substrate 100 and the SOI layer 101a associated therewith.

Additional trench processing steps may be optionally completed prior to the deposition of the polysilicon material 104. For example, the trench 105 may be lined with an isotopically deposited dielectric layer 103a (node dielectric or dielectric liner). The dielectric liner 103a may include, for example, oxides, nitrides, oxynitrides and/or high-k materials, and can be formed within the openings by any suitable process such as thermal oxidation, thermal nitridation, ALD, or CVD.

In one embodiment, the dielectric liner 103a may comprise a high-k material selected from high-k materials, including $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. The node dielectric material can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the node dielectric material can have a thickness in a range from 1 nm to 10 nm, although other thicknesses are contemplated in accordance with the teachings provided herein.

In one embodiment, the polysilicon material 104 is in-situ doped. In one embodiment, the deposited polysilicon material is doped (using any suitable implantation method) to be n-doped material.

In one embodiment, inner spacers or collars 106 may be deposited upon the trench 104 perimeter and upon the sidewall(s) 105a of trench 105 using any suitable deposition technique, e.g. for example, chemical vapor deposition (CVD) or physical vapor deposition (PVD). The spacer material may include Silicon nitride (SiN), Silicon-boron-carbonitride (SiBCN), SiliconCarbooxy-nitride (SiOCN) and Siliconcarbooxide (SiOC). An upper surface of spacers 106 may be coplanar with the upper surface of the layer 101a. In one embodiment, the inner spacers 106 can be utilized where the polysilicon 104 filling the trench 105 is formed to a height where the upper surface 104b of the polysilicon 104 is below the upper surface of the SOI layer 101a. Alternatively, the upper surface 106b of the spacers 106 may be above the upper surface of the SOI layer 101a. In one embodiment, the collars 106 assist with trench completion and subsequent polycrystalline deposition.

Figure 3A:
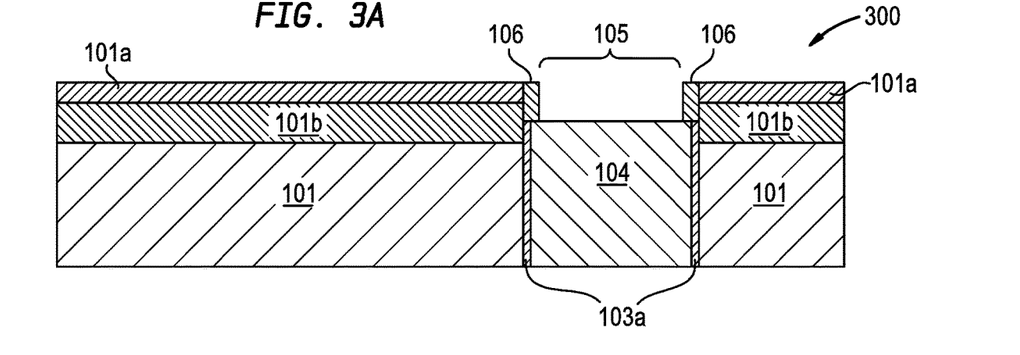
FIG. 3A illustrates removal of the hardmask and trench formation in accordance with at least one embodiment of the present disclosure.
Figure 3B:
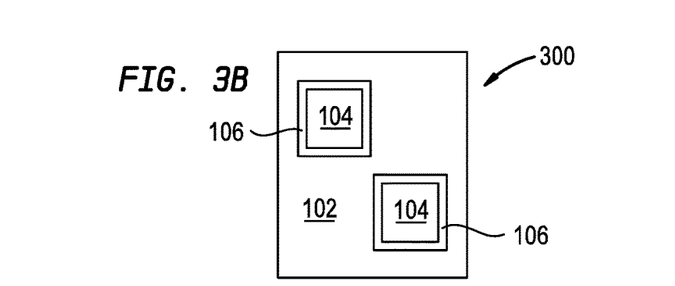
FIG. 3B illustrates a top-down view of the structure associated with FIG. 3A.

FIG. 3A illustrates removal of the hardmask off of the structure of 200, resulting in structure 300. FIG. 3B illustrates a top-down view of the structure 300. The hard mask 105 may be removed by using a selective etch process or any other suitable method. In one embodiment, wet etching which has selectivity between the hard mask and the underlying substrate 100 and associated SOI layer 101a can be used. Hydrofluoric acid (HF), buffered hydrofluoric acid (BHF) or other materials or combinations of materials may be used to remove the hard mask 105. A dry etch process such as RIE may also be used.

Figure 4A:
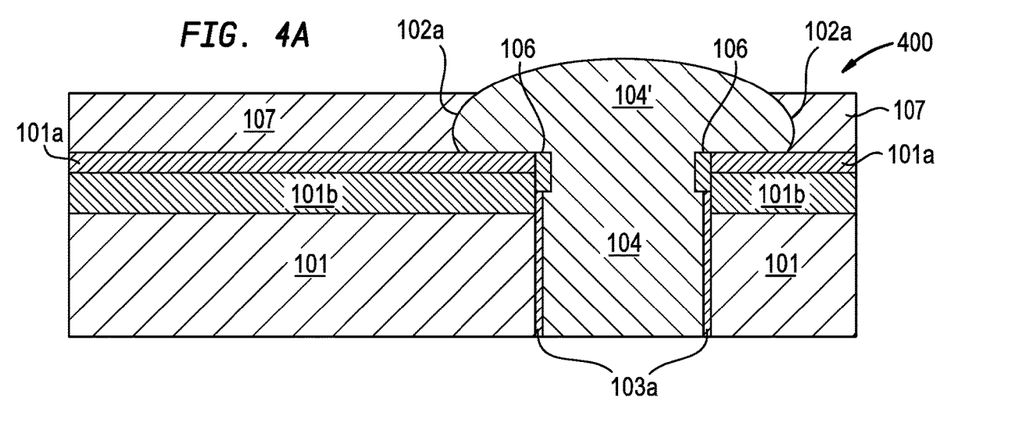
FIG. 4A illustrates an epitaxial growth process in accordance with at least one embodiment of the present disclosure.
Figure 4B:
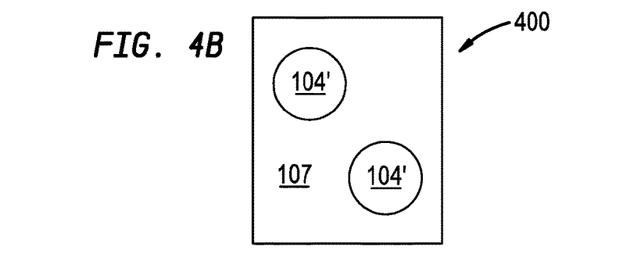
FIG. 4B illustrates a top-down view of the structure associated with FIG. 4A.

FIG. 4A illustrates performing an growth process to structure 300, where, per one embodiment of the present disclosure, the growth process results in a merger of the two layers at 102a over the substrate 100, at least a portion of which can form the basis of a strap as discussed below, and associated SOI layer 101a, resulting in a structure 400. FIG. 4B illustrates a top-down view of the structure 400. In one embodiment, a growth process occurs over the trench 105 and over the SOI layer 101a, where substrate 100 and associated SOI layer 101a are single crystalline layers/structures, as such the growth associated therewith is epitaxial in nature. In one embodiment, initiating growth under these conditions results in grown material grown from a polycrystalline material, e.g. polysilicon, which is non-epitaxial, and which grows at a faster rate, relative to epitaxial growth from single crystalline surface of semiconductor materials. Therefore, growth of material 104*a* from polysilicon 104 occurs at a faster rate than the epitaxial growth of material associated with layer 107, e.g. a heavily in-situ doped source layer 107, over SOI layer 101*a*, which results in a thicker or more polycrystalline grown material with respect to 104*a* relative to epitaxially grown material associated with the doped source layer 107. The epitaxial growth associated with the material 104*a* and 107 results in an electrical connection between the two layers, with interfaces at 102*a*, as the single crystalline material over the SOI layer 101*a* merges with the polycrystalline/polysilicon material 104*a* that is grown over the deposited polysilicon material 104 in the trench. (Polysilicon material 104*a* is referred to interchangeably as polysilicon 104*a*, polysilicon material 104*a*, polysilicon layer 104*a*, or layer 104*a*). Since the substrate 100 is a single crystalline material, doped source layer 107 will also be single crystalline material, e.g. a single crystalline silicon layer, and similarly, as stated and implied, material 104*a* will be polycrystalline, e.g. polysilicon. Per one embodiment, both doped source layer 107 (and single crystalline) and material 104 are doped with matching dopant types (using any suitable implantation method, including being in-situ doped), where doped source layer 107 is a doped silicon layer with a heavy dopant concentration e.g. a dopant concentration in a range from about $10^{19}$ to about $10^{22}$ atoms/cm$^3$. In one embodiment, layer 107 and 104*a* are both n-doped layers, which can match the n-dopant of the base substrate 101, where in one embodiment, arsenic is used as a dopant for layer 101, 104, and layer 107.

The growth associated with doped source layer 107 and polysilicon material 104, which, as stated, forms interface 102*a* between the two layers, effectively merging and electrically connecting them, forms the basis for a strap to link or merge the doped source layer 107 to the to-be-deposited transistor structure and polysilicon material 104. As such, the connection between 104' and 107 forms the basis for establishing a connection between a layer, e.g. the channel, of a vertical transistor device that formed over one or more layers on top of the substrate 100. In one embodiment, as discussed below, the strap provides a conductive path with the polysilicon material 104, e.g. the capacitor of the eDRAM, and the subsequently deposited vertical transistor, where the polysilicon material 104, which forms the basis of an eDRAM capacitor, is connected directly to grown layer 104*a* and epitaxially grown layer 107 as a result of the merger that takes place by virtue of the process as laid out herein.

Examples of materials that can be used for initiating the epitaxial growth process include Si or SiGe, which can include in-situ doped Si or SiGe. The specific material depends upon the underlying seed material, and as stated, in the instance where Si forms the basis for layers 101, 101*a* and material 104, the grown layers 104*a*, 107 will be silicon. Examples of various epitaxial growth process apparatuses that are suitable for use in forming epitaxial semiconductor material of the present application include, e.g., reduced pressure chemical vapor deposition (RPCVD), rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the epitaxial semiconductor material typically ranges from 450° C. to 900° C.

Figure 5A:
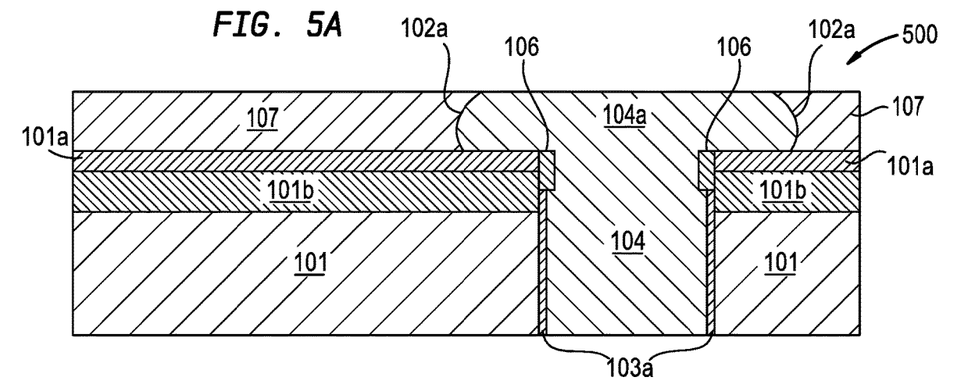
FIG. 5A illustrates a chemical-mechanical planarization process in accordance with at least one embodiment of the present disclosure.
Figure 5B:
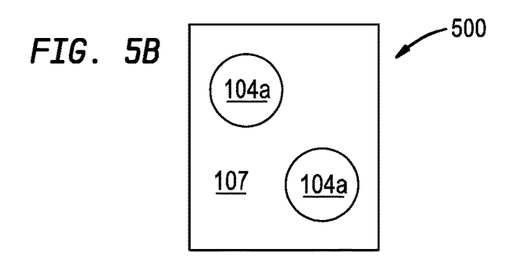
FIG. 5B illustrates a top-down view of the structure associated with FIG. 5A.

Given the nature of the process as described herein, layer 104*a* will likely overshoot over doped source layer 107, as shown in FIG. 4A. Accordingly, as illustrated in FIG. 5A and per one embodiment, any suitable chemical-mechanical planarization (CMP) process can be applied to layer 104*a* to remove any excess grown material that extends on top of the structure 400, where the CMP process results in structure 500. FIG. 5B illustrates a top-down view of the structure 500.

Figure 6A:
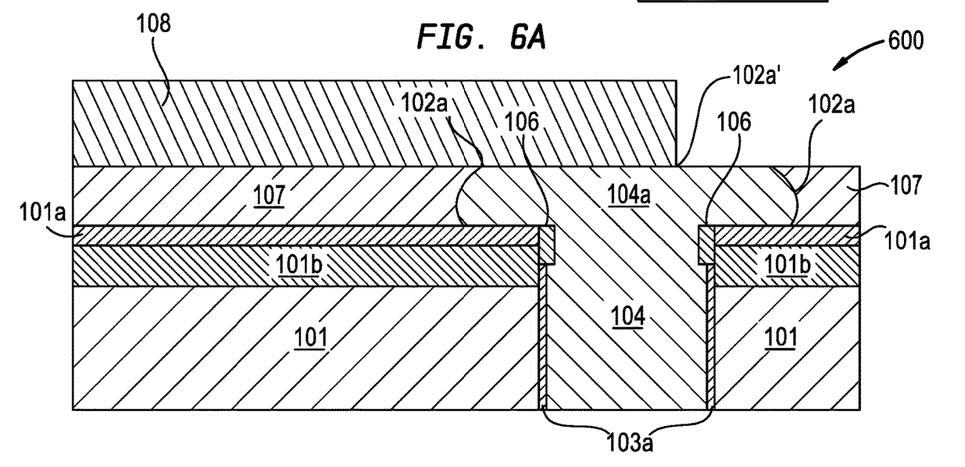
FIG. 6A illustrates another hardmask deposition in accordance with at least one embodiment of the present disclosure.
Figure 6B:
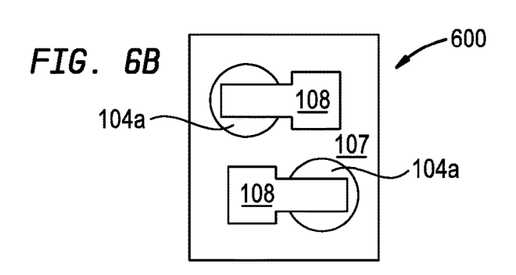
FIG. 6B illustrates a top-down view of the structure associated with FIG. 6A.
Figure 7A:
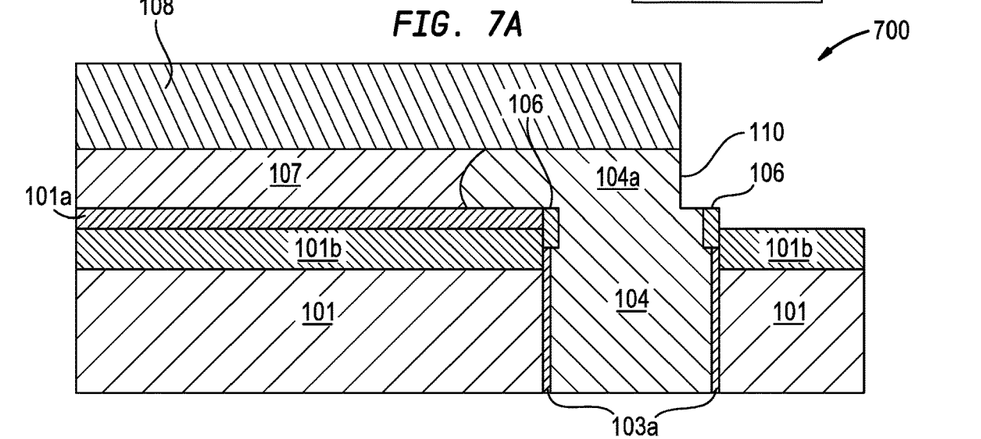
FIG. 7A illustrates an etching process in accordance with at least one embodiment of the present disclosure.
Figure 7B:
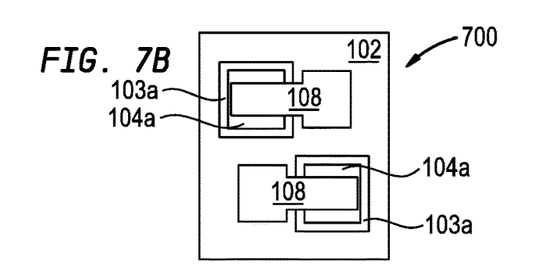
FIG. 7B illustrates a top-down view of the structure associated with FIG. 7A.

FIG. 6A and FIG. 7A) illustrate structures 600 and 700, respectively. FIG. 6B and FIG. 7B illustrate a top-down view of structures 600 and 700, respectively. In FIG. 6A, per one embodiment, and contrary to conventional techniques, a second hardmask is deposited using any suitable deposition technique, e.g. a second hardmask or cutmask 108, is deposited over a portion of layer 107 and 104*a* such that a strap basis layer 102*a*' is formed, e.g. it will become the strap after completion of STI formation, resulting in structure 600. As above, the second hardmask 108 can be a nitride, oxide, or other suitable material. After depositing the second hardmask 108, the exposed portion of the strap basis layer 102*a*' and the exposed portion of the SOI layer 101*a* are removed using a suitable etch process, e.g. reactive ion etching (RIE) to create an opening 110, resulting in structure 700. In one embodiment, the RIE technique can be substantially anisotropic. In one embodiment, the opening leaves the top portion of 104, a lateral portion of 104*a*, and the BOX 101*b* exposed. In effect, per one embodiment, opening 110 can be considered a shallow-trench isolation (STI) trench 110, as 110 will be filled, as described below, with a suitable STI material.

In one embodiment, the hardmask 108 protects underlying portion of covered material, e.g. 104, while leaving unwanted portions of unwanted material, e.g. polycrystalline material, exposed, where the unwanted material is subsequently removed. The cutmask 108 can be formed by deposition and etching. The cut mask 108 allows one to remove all un-needed semiconductor material outside the regions of the exemplary structure which include the to-be-formed VFT device and the eDRAM (including a to-be-formed STI region). As such, in one embodiment, the cutmask 108 is an eDRAM cutmask 108 that enables the enhancement of device density and disables eDRAM shorts. In one embodiment, the cutmask 108 can include a dielectric material that is compositionally different from any of the spacer materials.

In one embodiment, the hardmask 108 is selected to cover no more than half of the material 104 filling the trench along the lateral direction, and in turn enable removal of a portion of unwanted silicon and polycrystalline material underlying the hardmask corresponding to the length. In one embodiment, half or less of the trench length in the lateral direction is covered by the mask, which in turn, and as discussed below, which facilitates the strap, e.g. a shortened strap distance, and vertical transistor structure according to at least one embodiment as described below. In one embodiment, a shallow trench isolation structure (STI), as discussed below, will be deposited over an opening after removal of the hardmask 108, and it will have a slight offset into the trench, e.g. it will cover no more than half of the area of the trench.

Figure 8A:
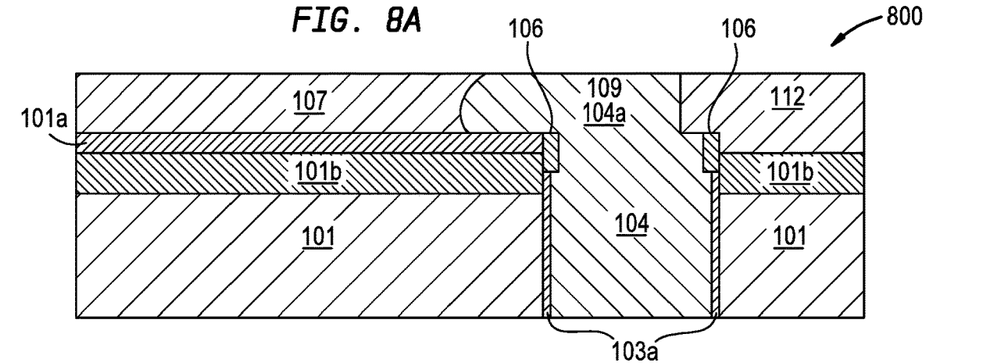
FIG. 8A illustrates formation of a shallow-trench isolation region/layer in accordance with at least one embodiment of the present disclosure.
Figure 8B:
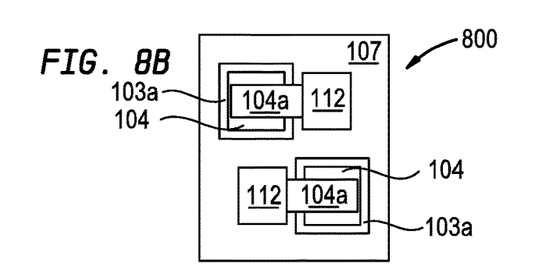
FIG. 8B illustrates a top-down view of the structure associated with FIG. 8A.

FIG. 8A illustrates structure 800, which includes removal of the hardmask 108 and the filling of the STI trenches 110 to form STI region 112 and final formation of a strap 109, resulting in structure 800. FIG. 8B illustrates a top-down view of structure 800. The hardmask 108 can be removed using any suitable etch process, including wet etching which has selectivity between the hard mask and the underlying layers 107 and 104*a*. Hydrofluoric acid (HF), buffered hydrofluoric acid (BHF) or other materials or combinations of materials may be used to remove the hard mask 115. Accordingly, in one embodiment as shown above, a cut mask or second hardmask 108 is formed, and thereafter, the doped polycrystalline semiconductor material not protected by the cut mask is removed, while a portion of the doped polycrystalline semiconductor material remains beneath the eDRAM mask and is in contact with the doped crystalline semiconductor material, which in turn allows for a denser completed eDRAM structure as described below.

The STI region 112 can be formed using any suitable process, including depositing an insulator or dielectric material, e.g. an oxide or nitride, in the opening 110 using suitable deposition techniques, bringing the STI region 112 in direct contact with the BOX layer 101b. Once the STI region 112 is formed, the connection between 104a and 104 into 107 constitutes the strap 109 that allows the ultimate transistor structure to electrically connect to the eDRAM capacitor. As shown, and according to one embodiment, the STI region 112 forms an interface with layer 104 and layer 104a such that it can isolate structure 800 (and any vertical devices constructed over structure 800), while still permitting a direct electrical communication with any device built over structure 800 and layer 104, e.g. eDRAM capacitor. That is to say, the opening 110 and subsequent deposition of STI region 112 are such that the material filling and over the trench 104 and 104a is not isolated from the rest of the structure 800, e.g. the STI region 112 extends only partially over layer 104. Although not expressly shown, any excess deposited STI material can be removed by a suitable CMP process. In one embodiment, STI region 112 surrounds the filled trench 105 (filled with polysilicon 104), which enables a much larger strap size and denser packing of vertical transistor devices on a single substrate. The STI region 112 isolates one device from another (lateral) device and addresses shorting issues associated therewith (as explained above), which can be particularly acute problems at nodes less than or equal to 14 nm. FIG. 9B discussed below provides a high level overview of these benefits by illustrating the enhanced density and insulation this scheme affords.

Figure 9A:
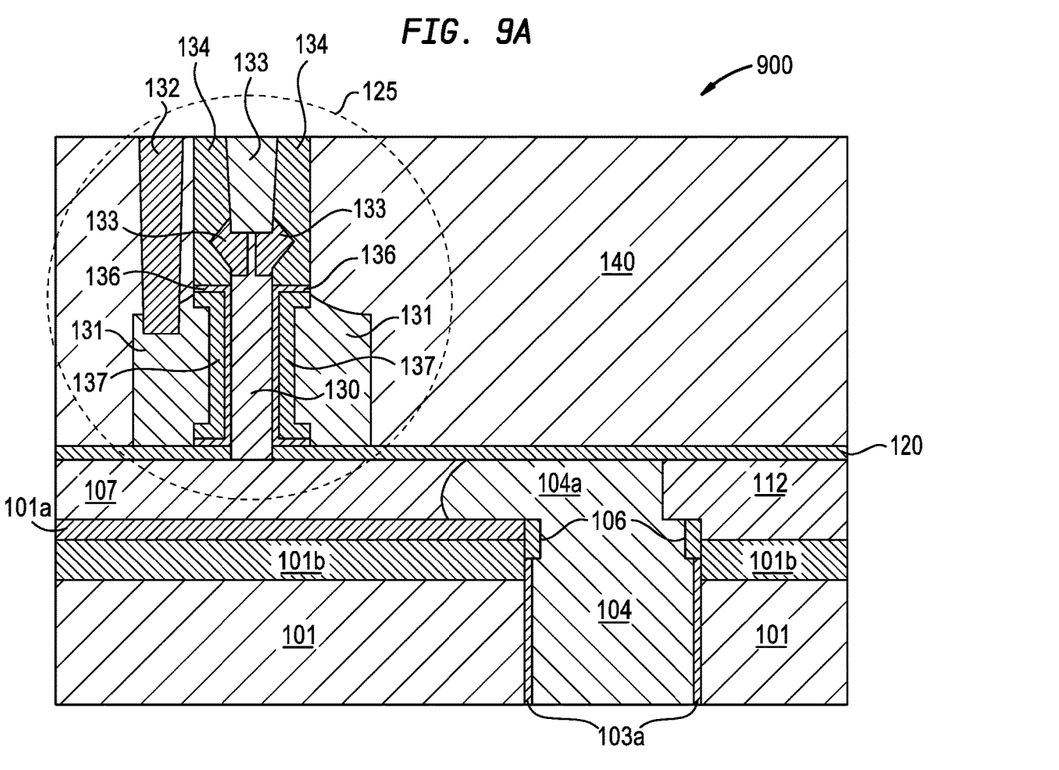
FIG. 9A illustrates formation of a vertical transistor structure in accordance with at least one embodiment of the present disclosure.
Figure 9B:
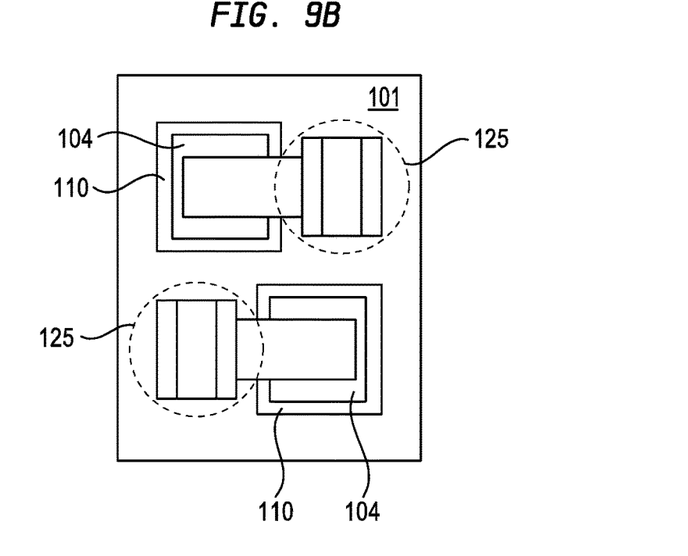
FIG. 9B illustrates a top-down view of the structure associated with FIG. 9A.

FIG. 9A illustrates structure 900, which includes a fully formed vertical transistor 125 over the device 800. U.S. Pat. No. 9,525,064 entitled "Channel-Last Replacement Metal-Gate Vertical Field Effect Transistor," and U.S. Pat. No. 9,806,173 also entitled "Channel-Last Replacement Metal-Gate Vertical Field Effect Transistor," the entirety both of which is incorporated herein by reference, discloses a vertical transistor and method of making the same over a suitable surface. FIG. 9B is a top-down view of structure 900. In the present disclosure, in order to establish connection with device 800, including layer 104, a bottom spacer 120, referred to herein for convenience as a transistor spacer layer, is deposited over structure 800, e.g. over layer 107, 104a, and 112. As above, the transistor spacer 120 can be deposited according to any suitable deposition process, for example, chemical vapor deposition (CVD) or physical vapor deposition (PVD). The transistor spacer 120 can include an insulating material, e.g. a nitride, for example, Silicon nitride (SiN), Silicon-boroncarbonitride (SiBCN), Silicon carbooxy-nitride (SiOCN) and Silicon carbooxide (SiOC). In one embodiment, the spacer 120 can have a thickness of about 3 to about 15 nm.

According to one embodiment, the spacer 120 is etched using a process that is selective to (will not substantially remove) material associated with doped source layer 107, e.g. the heavily doped source material, e.g. for example, a reactive ion etch (ME), in order to expose a portion of the underlying source contact layer, e.g. doped source layer 107, which in turn can enable the channel 130 of the vertical transistor 125 to electrically connect directly through the structure, including to polysilicon material 104, e.g. eDRAM capacitor. Heavily doped concentration as used herein can mean having a dopant concentration of $1 \times 10^{19}$ $cm^{-3}$ to $1 \times 10^{21}$ $cm^{-3}$, or as is otherwise understood and/or suitable in the art. Suitable vertical transistor fabrication process can be modified to enable this connection, e.g. by developing the structure 800 as described herein, depositing spacer 120 there-over, and etching spacer 120, selectively, to enable growth or deposition of the channel 130 in a manner that connects through the device, e.g. electrically connects to layer 104 by directly physically contacting doped source layer 107. In one embodiment, complete fabrication of the vertical transistor can result in the transistor 125 having a channel 130 connected to a heavily doped source layer 107, one or more thin dielectric layers 136, e.g. thin oxide, in contact with the channel 130, one or more work function metals 137 in contact with the one or more thin dielectric layers 136, which in turn are connected to one or more metal gate materials 131. The structure can further include a gate contact 132 in contact with the metal gate material 131, a dielectric capping layer 133 in contact with the channel 130 and material 135 associated with a drain region of the device 125, and one or more device spacers 134 in contact with the one or more dielectric layer 136. Per one embodiment, after all device steps are carried out to form the transistor device 125, and inter-layer dielectric material (ILD) 140 is formed over the structure 900, where material 140 can include any suitable ILD material, such as, a low-k dielectric material (with k<4.0), including but not limited to, silicon oxide, spin-on-glass, a flowable oxide, a high density plasma oxide, borophosphosilicate glass (BPSG), or any combination thereof. The ILD layer can be deposited by a deposition process, including, but not limited to CVD or PCVD. Other embodiments and configurations are contemplated, provided that a direct path for the channel 130 of a deposited vertical transistor device 125 and the rest of the structure, e.g. an electrical connection to an eDRAM capacitor region, can be established. Since the contents of this disclosure, pursuant to at least one embodiment described herein, provide for a direct path for deposition, e.g. epitaxial growth, of the channel 130, an advantage is offered over other schemes where an additional cut step, e.g. fin cut, may be omitted and electrical connection can be created directly when the transistor 125 is formed over the spacer 120.

Although not expressly stated above, the semiconductor material that provides for the single crystalline layer 107 and the polycrystalline material 104 may comprise a same semiconductor material as that which provides the channel 130. In other embodiments of the present application, the semiconductor material that provides single crystalline layer 107 and the polycrystalline material 104 may comprise a different semiconductor material than that which provides the channel 130. For example, the of the single crystalline layer 107 and the polycrystalline material 104 can include a silicon germanium alloy, while the channel 130 can be composed of silicon.

In one embodiment, as a result of a cutmask 108 placement as described above, the VTFET device is in close proximity to an associated EDRAM trench in relation to an underlying substrate, e.g. at least one-third offset in the lateral direction along the underlying substrate such that the distance between the VFFET and the trench is less than or equal to one third the substrate length in the lateral direction.

In one embodiment, the hard mask 108 facilitates a strap 109 length such that the strap is as short as possible, while permitting a slight offset between the VTFET and the EDRAM trench and enabling the distance between the VTFET to be as described, e.g. one third the substrate length in the lateral direction.

As such, at least one embodiment of the present disclosure offers an embedded dynamic access memory (eDRAM) cell with a trench present in a SOI substrate and laterally adjacent to a vertical transistor device, where a strap composed of a doped polycrystalline semiconductor material connects a polycrystalline semiconductor material of the eDRAM structure to the source/drain region of the vertical transistor device.

FIG. 9B illustrates a high-level, top-down overview, of a structure 900 demonstrating one of the benefits of at least one embodiment of the present disclosure. One or more vertical transistors located on a substrate 101 are electrically isolated from one another by each respective STI region 112. The trenches filled with polysilicon 104 are permitted to form unencumbered connections because each vertical transistor 125 is electrically isolated from the other. Moreover, because the STI 112 interface (as discussed above) permits for a larger strap size, a denser packing of the devices 125 on the substrate 101 is possible.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
providing an SOI substrate with a buried insulator layer therein;
forming a trench through the substrate;
filling the trench with a first polysilicon material;
after filling the trench with the first polysilicon material, i) growing a second polysilicon material over the first polysilicon material and ii) epitaxially growing a doped layer over the SOI substrate, wherein the grown second polysilicon material and epitaxially grown doped layer form a basis for a strap merging the doped layer and the second polysilicon material; and
performing a planarization process on an excess portion of the grown second polysilicon material that grows over the doped layer.

2. The method according to claim 1 further comprising:
prior to filling the trench with polysilicon material, depositing a first hard mask over the substrate;
prior to filling the trench with polysilicon material, depositing a dielectric liner along an exposed perimeter of the trench; and
after filing the trench with the second polysilicon material, removing the first deposited hardmask.

3. The method according to claim 1, wherein i) the doped layer, ii) the first polysilicon material, iii) the second polysilicon material, and iv) a base portion of the SOI substrate are doped with a same dopant-type.

4. The method according to claim 3, wherein i) the doped layer, ii) the first polysilicon material, iii) the second polysilicon material, and iv) a base portion of the SOI substrate are n-doped.

5. The method according to claim 3 further comprising:
prior to performing the epitaxial growth, depositing a plurality of inner spacers on at least two exposed sidewalls of the trench.

6. The method according to claim 1 further comprising:
depositing a second hardmask over a portion of the doped layer and the second polysilicon material.

7. The method according to claim 6 further comprising:
removing an exposed portion of i) the doped layer and ii) the second polysilicon material to form a recess over a portion of the doped layer.

8. The method according to claim 7 further comprising:
removing the second hardmask; and
creating a shallow-trench isolation region in the recessed portion of the second doped layer, wherein the remaining portion of the second polysilicon material and the second doped layer form the strap, wherein the deposition of the second hardmask is such that it covers a suitable area such that when the second hardmask is removed the second hardmask enables a formation of the strap.

9. The method according to claim 8 further comprising:
forming a transistor spacer layer over the doped layer, the second polysilicon material, and the shallow-trench isolation region.

10. The method according to claim 9, wherein the shallow-trench isolation region partially extends over the first polysilicon material.

11. The method according to claim 9 further comprising:
forming a vertical transport field effect transistor structure over the transistor spacer layer.

12. A structure comprising:
an SOI substrate with a buried insulator therein;
a doped layer disposed over the SOI substrate;
a trench formed through the SOI substrate, with a dielectric liner deposited along an exposed perimeter therein;
a first polysilicon material filling the trench in the substrate;
a second polysilicon material in contact with the first polysilicon material, wherein the second polysilicon material and the doped layer form a connection over the SOI substrate, wherein the second polysilicon material and the doped layer are coplanar as a result of performing a planarization process on an excess portion of the second polysilicon material grown over the doped layer; and
a shallow-trench isolation (STI) region in contact with the connection, forming a strap in the structure and separating it from at least one neighboring device.

13. The structure according to claim 12 further comprising:
a plurality of spacers on at least two exposed sidewalls of the trench and in contact with the first polysilicon material; and
a transistor spacer layer over i) the doped layer, ii) the second polysilicon material, and iii) the shallow-trench isolation layer.

14. The structure according to claim 13 further comprising:
a vertical transistor structure over the transistor spacer layer.

15. The structure according to claim 14, wherein the vertical transistor structure includes a channel layer that contacts the doped layer through an opening in the transistor spacer layer.

16. The structure according to claim 14, wherein i) the doped layer, ii) the first polysilicon material, iii) the second polysilicon material, and iv) a base portion of the SOI substrate are doped with a same dopant-type.

17. The structure according to claim 16, wherein i) the doped layer, ii) the first polysilicon material, iii) the second polysilicon material, and iv) a base portion of the SOI substrate are n-doped.

18. The structure according to claim 16, wherein the doped layer is a heavily n-doped silicon layer and both the first polysilicon and the second polysilicon material are n-doped silicon layers.

19. A structure comprising:
   at least two Embedded Dynamic Random Access Memory (eDRAM) structures each including:
   an SOI substrate with a buried insulator therein;
   a doped layer disposed over the SOI substrate;
   a trench formed through the SOI substrate, with a dielectric liner deposited along an exposed perimeter therein;
   a first polysilicon material filling the trench in the substrate;
   a second polysilicon material in contact with the first polysilicon material, wherein the second polysilicon material and the doped layer form a connection over the SOI substrate, wherein the second polysilicon material and the doped layer are coplanar as a result of performing a planarization process on an excess portion of the second polysilicon material grown over the doped layer;
   a transistor spacer layer over i) the doped layer, ii) the second polysilicon material, and iii) the shallow-trench isolation layer;
   a shallow-trench isolation (STI) region in contact with the connection, forming a strap in the structure and separating it from at least one neighboring device and
   a vertical transistor structure over the transistor spacer layer, wherein the shallow-trench isolation region of one of the at least two eDRAM structures electrically isolates the vertical transistor structure of one of the at least two eDRAM structures from another vertical transistor structure of another one of the least two eDRAM structures.

* * * * *